United States Patent
Matsumoto

(10) Patent No.: US 6,871,329 B2
(45) Date of Patent: Mar. 22, 2005

(54) DESIGN SYSTEM OF INTEGRATED CIRCUIT AND ITS DESIGN METHOD AND PROGRAM

(75) Inventor: Sho Matsumoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 36 days.

(21) Appl. No.: 10/098,551

(22) Filed: Mar. 18, 2002

(65) Prior Publication Data
US 2003/0061585 A1 Mar. 27, 2003

(30) Foreign Application Priority Data
Sep. 25, 2001 (JP) .................................. 2001-291413

(51) Int. Cl.[7] .............................................. G06F 17/50
(52) U.S. Cl. ........................ 716/4; 327/270; 716/2; 716/6; 716/7
(58) Field of Search ............................. 716/2, 4, 6, 7, 716/1, 11, 18; 327/270

(56) References Cited

U.S. PATENT DOCUMENTS

| | | | |
|---|---|---|---|
| 5,508,937 A | * | 4/1996 | Abato et al. .................. 716/6 |
| 5,751,593 A | * | 5/1998 | Pullela et al. .................. 716/6 |
| 5,896,300 A | | 4/1999 | Raghavan et al. ............. 716/6 |
| 6,441,665 B1 | * | 8/2002 | Hashidate et al. .......... 327/270 |
| 2001/0010090 A1 | * | 7/2001 | Boyle et al. ................... 716/2 |

FOREIGN PATENT DOCUMENTS

JP 9-17875 1/1997

* cited by examiner

Primary Examiner—Thuan Do
(74) Attorney, Agent, or Firm—Staas & Halsey LLP

(57) ABSTRACT

A circuit modification portion modifies circuit information of an integrated circuit depending on a result of a timing test at a timing test portion to presume delay information at a delay presumption portion by modeling the circuit relating to its modified circuit information. Thereafter updating the circuit information and delay information of the integrated circuit at an information update portion to re-test the timing. This allows to carry out a timing analysis/test of the modified circuit without designing layout with the modified circuit information, which is required in a conventional design method. As a result, the number of designing the layout in the integrated circuit design is reduced to shorten time required for the layout design, which allows to shorten time required for the layout design process (layout design, timing analysis/test, and timing adjustment).

20 Claims, 6 Drawing Sheets

F I G. 3A
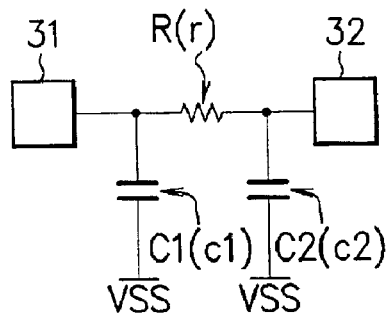
F I G. 3B
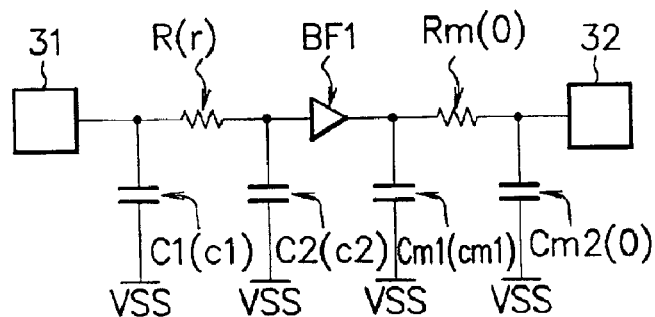
F I G. 3C
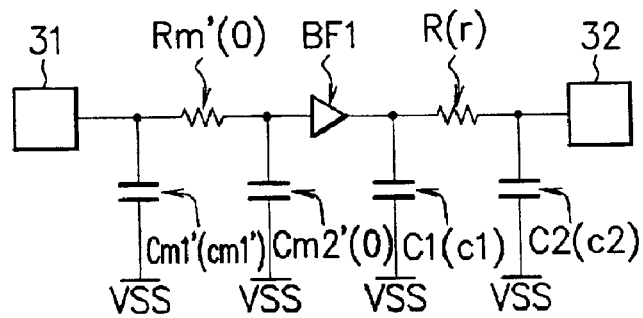
F I G. 3D
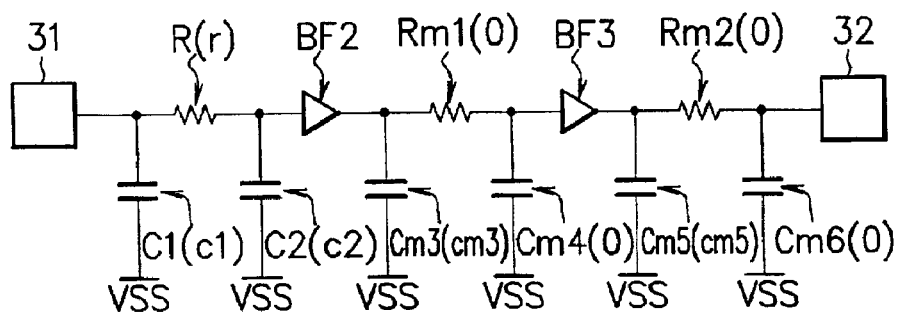

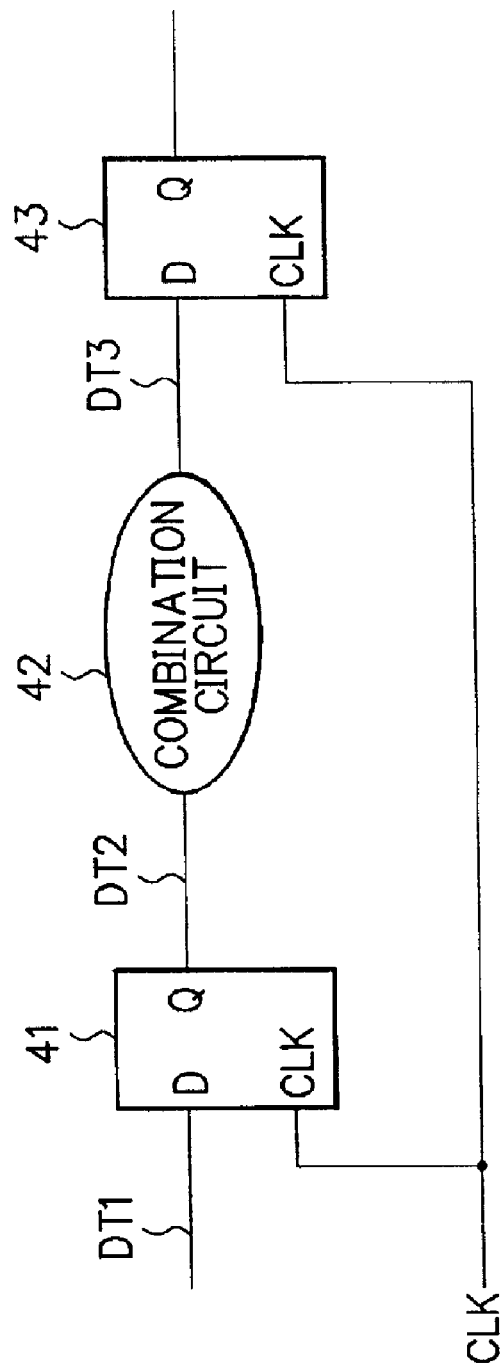
F I G. 5

DESIGN SYSTEM OF INTEGRATED CIRCUIT AND ITS DESIGN METHOD AND PROGRAM

CROSS-REFERENCE TO RELATED APPLICATIONS

This application is based upon and claims priority of Japanese Patent Application No. 2001-291413, filed on Sep. 25, 2001, the contents being incorporated herein by reference.

BACKGROUND OF THE INVENTION

1. Field of the Invention

The present invention relates to a design system of an integrated circuit and a design method and program of the integrated circuit and, more particularly, to the design system of the integrated circuit in order to analyze and adjust timing in the integrated circuit when designing the layout of the integrated circuit.

2. Description of the Related Art

In recent years, the layout design, which organizes the arrangement of respective circuit elements (e.g. logic gates) composing the integrated circuit on a chip and wiring between these circuit elements, has been complicated as the integrated circuit becomes large in scale and high-speed and the process becomes refined. The conventional layout design carries out physical layout on an actual chip, or the arrangement of respective circuit elements and wiring between these circuit elements based on circuit-connection information of the logic image which is made by hardware description language or the like. Such a layout design is generally made by using software.

Whether the timing error that disturbs the normal operation of a circuit exists in one circuit of which layout is arranged, is tested by a timing analysis, based on such information as a net list which shows circuit elements composing the arranged circuits and their wirings.

Details of the timing error will be explained with reference to FIGS. 5 and 6.

FIG. 5 is a schematic circuit diagram for explaining what the timing error is. FIG. 6 is a timing chart showing one example of operation in the circuit shown in FIG. 5.

In FIG. 5, the reference numbers 41,43 designate D-type flip-flops (hereinafter referred to "DFF"). The number 42 is a combination circuit for a logical operation such as addition and multiplication rules of arithmetic.

A signal DT1 input to a DFF41 is outputted as a signal DT2 from the DFF41 synchronizing a rise time (e.g. at a time T12 in FIG. 6) of a clock signal CLK. The signal DT2 is input into and specifically and logically operated in the combination circuit 42. The operation result in the combination circuit 42 is outputted as a signal DT3 and input to the DFF 43.

The time at that the signal DT3 outputted from the combination circuit 42 is sent to the DFF 43 lags behind the time at that the signal DT2 is outputted from the DFF 41 (time lag). This time lag is caused by the arithmetic operation in the combination circuit 42 and by the wiring as a propagation path over which signals are sent between the DFFs 41 and 43 via the combination circuit 42.

A sequence circuit such as the DFF, which captures an input signal with synchronizing a synchronizing signal (e.g. clock signal), defines therein a set-up time Ts for determining and holding the input signal before capturing the input signal. The sequence circuit also defines therein a hold time Th during which the input signal does not change and remains after capturing the input signal at its capturing time. A state in which these defined times Ts and Th are not assured is called a timing error. Other states except for the defined set-up time Ts are called set-up errors. Other states except for the defined hold time Th are called hold errors.

The timing error will be explained in detail with reference to FIG. 6. Signals CLK, DT1, and DT2 in FIG. 6 are the same with those in FIG. 5. Signals DT3-A to DT3-C are one particular details of the signal DT3 shown in FIG. 5. The signal DT3-A does not indicate the timing error of the signal DT3, while the signal DT3-B brings about the timing error (Set-up error) of the signal DT3 and the signal DT3-C also brings about the timing error (Hold error) of the signal DT3.

Taking an instance shown as the signal DT3-A in FIG. 6, the time lag because of the signal propagation between the DFF 41 and the DFF 43 is later than the hold time of the DFF 43 and earlier than a time (T−Ts) which subtracts the set-up time Ts of the DFF 43 from the clock cycle T. The signal DT3-A changes after the hold time Th and before the set-up time Ts for the next rise time T13 of the clock signal CLK. As a result, no timing error appears in the circuit shown in FIG. 5, which ensures the normal operation.

Taking another instance as the signal DT3-B in FIG. 6, when the time lag because of the signal propagation between the DFF 41 and the DFF 43 is later than a time (T−Ts) which subtracts the set-up time Ts of the DFF 43 from the clock cycle T, the change time of the signal DT3-B does not satisfy the definition of the set-up time Ts for the time T13. The thus-outputted signal (data) from the DFF 41 is propagated too late to the downstream DFF 43. As a result, the timing error (Set-up error) appears in the circuit shown in FIG. 5.

Taking still another instance as the signal DT3-C in FIG. 6, when the time lag because of the signal propagation between the DFF 41 and the DFF 43 is earlier than the hold time Th of the DFF 43, the signal DT3-C changes during the hold time Th for the time T12, which does not satisfy the definition of the hold time Th. The thus-outputted signal (data) from the DFF 41 is propagated too early to the downstream DFF 43. As a result, the timing error (Hold error) appears in the circuit shown in FIG. 5.

In a design of the integrated circuit, when such timing errors appear in the circuit of which layout is arranged from the timing analysis results thereof, the timing is adjusted to recover the timing error. The actual timing adjustment is to change the arrangement of circuit elements and their wiring, or to change the circuitry (by adding a buffer).

The timing adjustment is required whenever the set-up error or the hold error is recognized in the timing analysis test. The timing adjustment to recover the set-up error is generally carried out first since it may difficult to be independently recovered with no harm to others, and thereafter the hold error is recovered.

The conventional design method of the integrated circuit requires to carry out the layout re-designing and timing analysis re-testing whenever the timing is adjusted to recover the set-up error and hold error respectively that are recognized above in the timing analysis test.

Meaning that when designing the layout, which finally determines the arrangement of respective circuit elements composing the integrated circuit on a chip and wiring between these circuit elements, the conventional design method of the integrated circuit requires to carry out such layout design operations as; a first layout design→the first timing analysis/test→the first timing adjustment (Set-up error adjustment)→a second layout design→the second timing analysis/test→the second timing adjustment (Hold error adjustment)→a third layout design→the third timing analysis/test.

The layout design is also time-consuming despite the use of software or the like since the integrated circuit recently becomes large in scale (due to an increase in the number of gate composing one integrate circuit).

The operations starting from the first timing adjustment (Set-up error adjustment) are again required when a new set-up error that appears in the second timing adjustment (Hold error adjustment) is recognized in the third timing analysis/test. Thereby the conventional layout design process requires to carry out the layout design, timing analysis test, and timing adjustment repetitively until no timing errors appear in the circuit of which layout is arranged.

Therefore, it is time-consuming to design the layout where all timing errors are recovered (restored) to organize the arrangement of respective circuit elements on a chip and wiring between these circuit elements.

SUMMARY OF THE INVENTION

The present invention is to solve such a problem and an object thereof is to shorten the time required for designing the layout of the integrated circuit.

A design system of an integrated circuit of the present invention includes a timing test portion testing timing of the integrated circuit, a circuit modification portion modifying circuit information of the integrated circuit, a delay presumption portion presuming delay information of the integrated circuit, and an information update portion updating to provide the circuit information and delay information of the integrated circuit. When modifying the circuit information at the circuit modification portion to recover a timing error recognized in the timing test portion, the delay presumption portion presumes the delay information from the modified circuit information without designing layout. The information update portion updates the circuit information and delay information of the integrated circuit based on the modified circuit information and the presumed delay information, to provide to the timing test portion.

According to thus-structured present invention, the delay information is immediately presumed from the modified circuit information to recover the timing error. This allows carrying out a timing analysis test without designing the layout after modifying the circuit information, which is required in a conventional design method to obtain the delay information.

BRIEF DESCRIPTION OF THE DRAWINGS

FIGS. 3A to 3D are diagrams showing one example of delay circuit models for estimating delay information, FIG. 5 is a circuit schematic view for describing a timing error.

DETAILED DESCRIPTION OF THE PREFERRED EMBODIMENTS

Details of an embodiment of the present invention will be explained based on the drawings.

Figure 1:
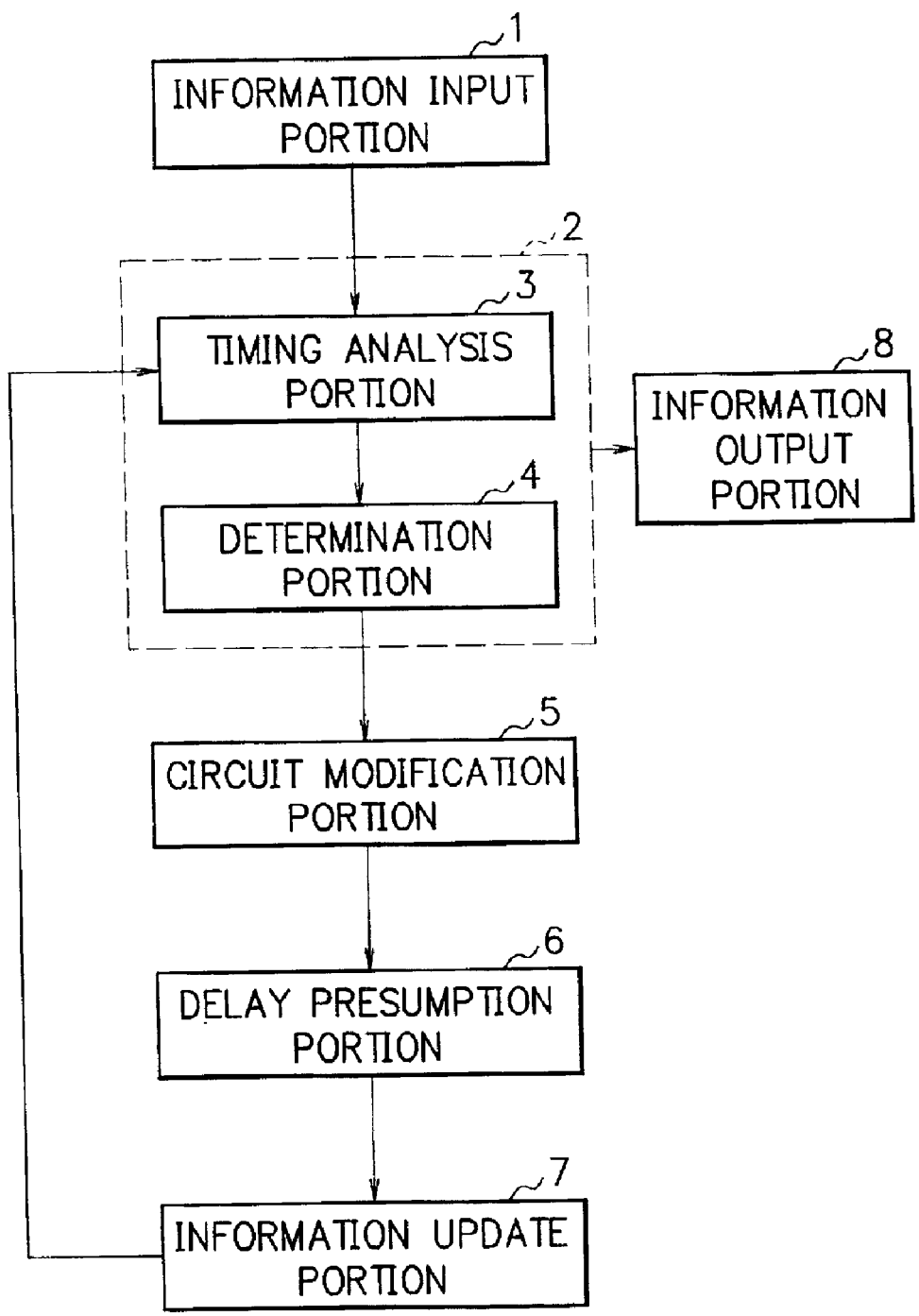
FIG. 1 is a block diagram showing one example of a circuit design system configuration to which applied is an integrated circuit design system related to the embodiment of the present invention.

FIG. 1 is a block diagram showing one example of a circuit design system configuration to which applied is an integrated circuit design system related to one embodiment of the present invention. The circuit design system shown in FIG. 1 is to carry out a timing analysis, its test, and timing adjustment of the circuit of which layout is arranged.

In FIG. 1, an information input portion 1 is to input a net list and delay information of the integrated circuit of which layout is arranged, wherein timing thereof is analyzed, tested, and adjusted in this circuit design system. Here, the net list comprises the circuit information that relates, with a logic image, circuit elements (e.g. logic gates) composing the integrated circuit and wiring between these circuit elements. The delay information is to represent delay information that lies in the circuit elements themselves and a resistance component, capacitance component (e.g. wire capacitance, parasitic capacitance), and time lag component (e.g. effect of round propagation signal), which depend on the lengths of wiring between the circuit elements.

A timing test portion 2 is composed of a timing analysis portion 3 and a determination portion 4.

The timing analysis portion 3 analyzes the timing with the use of the net list and delay information of the integrated circuit that are provided from the information input portion 1 or an information update portion 7.

The determination portion 4 determines whether the timing error (Set-up error, Hold error) exists in the integrated circuit or not, based on the timing analysis result provided from the timing analysis portion 3.

A circuit modification portion 5 adjusts the timing by modifying in response to the result determined at the determination portion 4 the net list (circuit element structure and wiring between circuit elements) of the integrate circuit to recover the timing error. A delay presumption portion 6 presumes the delay information without designing a new layout, depending on modification contents for the integrated circuit processed at the circuit modification portion 5.

The information update portion 7 updates the net list and delay information of the integrated circuit that are used in the timing analysis portion 3, based on the modification contents for the integrated circuit processed at the circuit modification portion 5 and the delay information presumed at the delay presumption portion 6. An information output portion 8 is to output such net list and delay information of the integrated circuit as determined in the timing test portion 2 that a process to recover the timing error is completed.

Hereinafter explained is the operation of a circuit design system.

Figure 2:
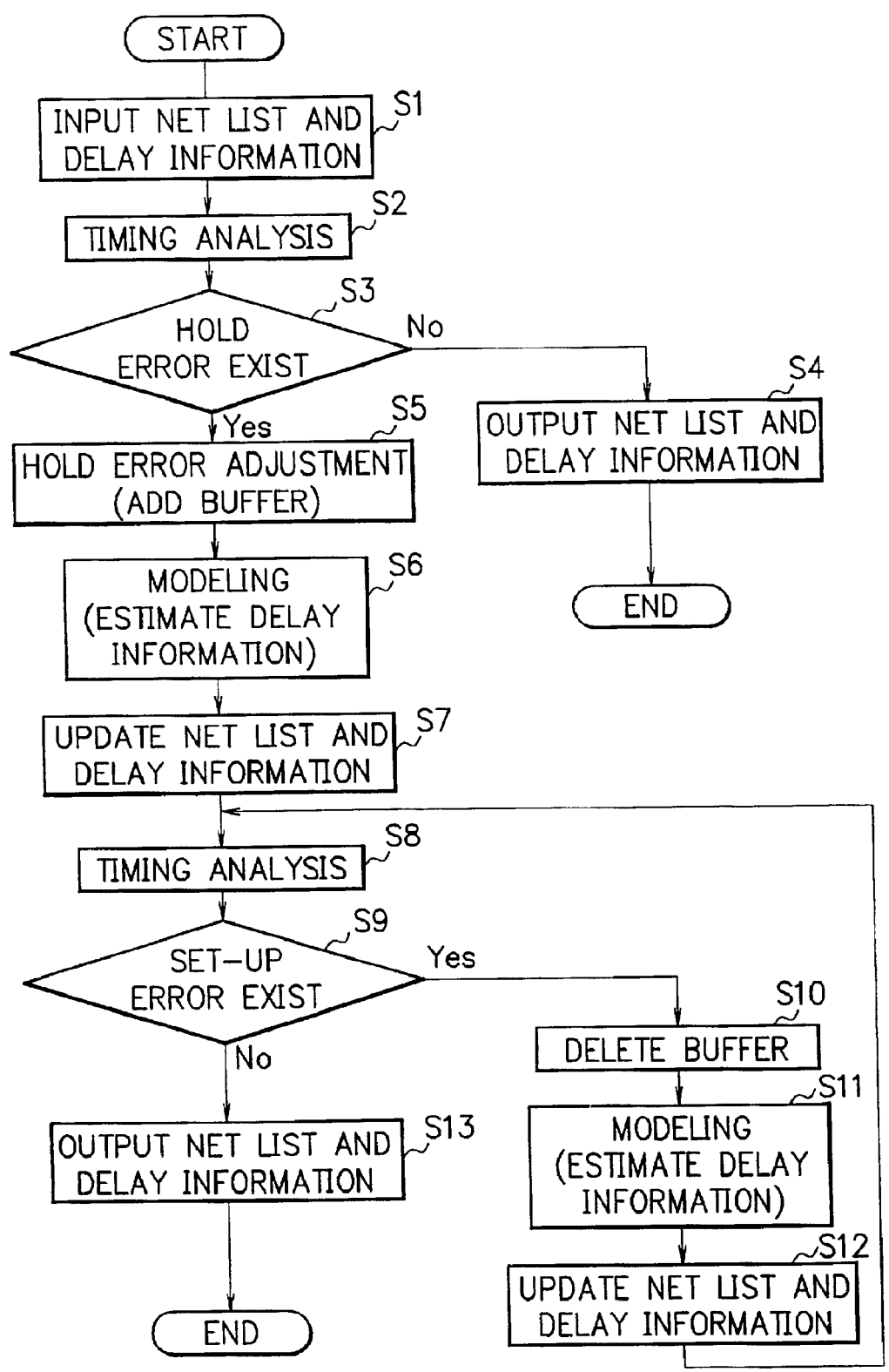
FIG. 2 is a flow chart showing the operation of the circuit design system related to this embodiment.

FIG. 2 is a flow chart representing the operation of the circuit design system shown in FIG. 1.

In a step S1, the net list and delay information of the integrated circuit of which layout is arranged are input from the information input portion 1. The net list and delay information of the integrated circuit input from this information input portion 1 are that the timing is already adjusted not to have the set-up error because of a physical signal (data) delay in the integrated circuit in order to operate the integrated circuit through a cycle of a clock signal provided. Meaning that the net list and delay information of the integrated circuit that are input from the information input portion 1 have once undergone the layout design and timing analysis/test to adjust the timing for recovering the set-up error.

In a step S2, the timing analysis portion 3 in the timing test portion 2 analyzes the timing with the use of the net list and delay information of the integrated circuit input from the information input portion 1 in the step S1. The timing analysis portion 3 further provides a timing analysis result to the determination portion 4. There included in the timing analysis result are the signal propagation time between flip-flops in the integrated circuit, the timing error information (Set-up error information and Hold error information), and the like.

As described above, the net list and delay information of the integrated circuit that are input to the step S1 have undergone the timing adjustment to recover the set-up error. Thereby in the step S2, it is only the hold error information in actual that is provided to the determination portion 4 as the timing error information.

In a step S3, the determination portion 4 in the timing test portion 2 determines whether the hold error exists in the integrated circuit or not, based on the timing analysis result provided from the timing analysis portion 3 in the step S2. When the above-determined result indicates that the hold error exists in the integrated circuit, the operation passes to a step S4 where the timing test portion 2 outputs the net list and delay information of the integrated circuit that are input to the step S1, via the information output portion 8 to complete the process.

When the determination portion 4 determines that the hold error exists in the integrated circuit according to the result determined in the step S3, the operation passes to a step 5. In the step S5, the circuit modification portion 5 adjusts the timing error (Hold error adjustment) by modifying the net list to add circuit elements (buffers) that intend to delay a signal to a signal propagation path (wiring) where the hold error appears. This recovers the hold error in the integrated circuit. In this step S5, the timing is adjusted for all the signal propagation paths (wiring) that are determined to have hold errors in the step S3. The timing adjustment (Hold error adjustment) is to only modify the net list and no layout is arranged.

The timing adjustment (Hold error adjustment) in the step S5 may be carried out by modifying the net list to select and add any one of a relevant buffer from a plurality of buffers having different time lags, while adding the relevant number of buffers having a constant time lag may also be available to modify the net list. These may be applied simultaneously as well.

In a step S6, the delay presumption portion 6 presumes the delay information by modeling a part of the circuit where the net list is modified through the timing adjustment (Hold error adjustment) in the step S5. Note that the modeling to presume this delay information will hereinafter be described in detail.

In a step S7, the information update portion 7 updates the net list and delay information of the integrated circuit that are used for the timing analysis in the step S2, based on the net list contents modified through the timing adjustment (Hold error adjustment) in the step S5, the delay information presumed in the step S6, and the delay information of the buffer added therein. Thus modified results through the timing adjustment (Hold error adjustment) are reflected on the net list and delay information of the integrated circuit.

In a step S8, the timing analysis portion 3 analyzes the timing with the use of the net list and delay information of the integrated circuit that are updated in the step S7, to provide its timing analysis results for the determination portion 4. In this step S8, the signal propagation time between flip-flops in the integrated circuit, the timing error information (Set-up error information and Hold error information), and the like are provided for the determination portion 4 as the timing analysis results.

In a step S9, the determination portion 4 determines whether the set-up error exists in the integrated circuit or not, based on the timing analysis results provided from the timing analysis portion 3 in the step S8. When thus-determined results indicate the existence of the set-up error in the integrated circuit, the operation passes to a step S10.

In the step S10, the circuit modification portion 5, based on the set-up error information, automatically modifies the net list to delete the buffer that is to be added in the signal propagation path (wiring) where the set-up error appears. This to-be-deleted buffer is what is added to recover the hold error in the step S5. Thus recovering the set-up error in the integrated circuit that appears by adding the buffer in the step S5. When a plurality of buffers is added in the signal propagation path (wiring) where the set-up error appears, either all buffers or one portion thereof may be deleted. In a step S11, the delay presumption portion 6 presumes the delay information, as with the step S6, by modeling a part of the circuit where the buffer is to be deleted in the step S10.

In a step S12, the information update portion 7 updates the net list and delay information of the integrated circuit that are used for the timing analysis in the step S8, based on the net list modification contents (buffer deletion) in the step S10, the delay information presumed in the step S11, and the delay information on the buffer added therein, and then returning to the step S8. Thus-modified results of the net list in the step S10 are reflected on the net list and delay information of the integrated circuit.

The processes between the step S8 and the step S12 are repeated until the determination portion 4 determines in the step S9 that no set-up error appears in the integrated circuit.

When the determination portion 4 determines in the step S9 that no set-up error appears in the integrated circuit, the operation passes to a step S13 where the timing test portion 2 outputs the net list and delay information of the integrated circuit via the information output portion 8 to complete the process.

Thereafter, a layout is arranged with the net list that has undergone the modification. (A low incidence of the timing error is available since the timing test through the estimation is previously carried out.)

In the operation shown in FIG. 2, when a new set-up error appears by adding the buffer to recover the hold error (step S5), the added-buffer is deleted in the step S10. This may cause to have the hold error again that has been recovered in the step S5. When the hold error re-appears, the buffer adding position or the like may be modified through the indication thereof to re-perform the operations shown in FIG. 2.

FIGS. 3A to 3D show one example of delay circuit models when the delay presumption portion 6 presumes (estimates) the delay information.

In FIGS. 3A to 3D, 31 and 32 designate circuit elements (cells) composed of a transistor, and BF1, BF2, and BF3 designate circuit elements (buffers) added to adjust the timing (to delay a signal), respectively. The signal is propagated from the circuit element 31 to the circuit element 32.

As described above, the delay information has the resistance component, the capacitance component, and the time lag component because of the wiring. As shown in FIGS. 3A to 3D, the delay presumption portion 6 models the wiring between respective circuit elements with the use of one resistance and two capacitance, which designate the resistance component and the capacitance component because of the wiring that connects respective circuit elements, for every portion between respective circuit elements.

One above-mentioned resistance is connected in series in a signal propagation path (wiring). Two above-mentioned capacitance are connected in parallel between the signal propagation path (wiring) and an electric source film of reference voltage VSS or the wiring, wherein one capacitance is connected to one end of the resistance, while the other capacitance is to the other end of the resistance.

In FIGS. 3A to 3D, what indicated in parentheses attached to codes of the resistance and capacitance designates a resistance value of the resistance component shown by the resistance and a capacitance value of the capacitance component shown by the capacitance, respectively.

① In a case where the buffer is not added. <FIG. 3A>
(In a case of the base circuit)

As shown in FIG. 3A, the delay presumption portion 6 models the wiring connecting between circuit elements with the use of the resistance R of the resistance value r, the capacitance C1 of the capacitance value c1, and the capacitance C2 of the capacitance value c2, which designate the resistance component and the capacitance component of the wiring that connects between the circuit element 31 and the circuit element 32. "T" designates the time lag component because of the round signal and the like, which are caused by the wiring length of the wiring that connects between the circuit element 31 and the circuit element 32, and the propagation over its wiring.

② In a case where the to-be-added buffer BF1 is arranged to imaginary overlap the circuit element 32. <FIG. 3B>
(A case where the to-be-added buffer is previously assumed to be arranged close to the circuit element 32 or where the buffer can be directed to be added to the side of the circuit element 32)

As shown in FIG. 3B, the delay presumption portion 6 models the wiring connecting between the circuit element 31 and the circuit element BF1 with the use of the resistance R of the resistance value r, the capacitance C1 of the capacitance value c1, and the capacitance C2 of the capacitance value c2, which designate the resistance component and the capacitance component of the wiring that connects between the circuit element 31 and the circuit element (buffer) BF1. The time lag component of the wiring that connects between the circuit element 31 and the circuit element BF 1 is designated as "T". Meaning that the wiring that connects between the circuit element 31 and the circuit element BF 1 is supposed to be interchangeable with the wiring, shown in FIG. 3A, that connects between the circuit element 31 and the circuit element 32.

The delay presumption portion 6 also models the wiring connecting between the circuit element BF1 and the circuit element 32 with the use of the resistance Rm and two capacitance Cm1, Cm2, which designate the resistance component and the capacitance component of the wiring that connects between the circuit element BF1 and the circuit element 32. Here, the delay presumption portion 6 sets the resistance value of the resistance Rm as 0 (zero), the capacitance value cm1 of the capacitance Cm1 as a capacitance value of the input terminal of the circuit element 32, and the capacitance value of the capacitance Cm2 as 0 (zero). The time lag component of the wiring that connects between the circuit element BF1 and the circuit element 32 is set to 0 (zero).

③ In a case where the to-be-added buffer BF1 is arranged to imaginary overlap the circuit element 31. <FIG. 3C>
(A case where the to-be-added buffer is previously assumed to be arranged close to the circuit element 31 or where the buffer can be directed to be added to the side of the circuit element 31)

As shown in FIG. 3C, the delay presumption portion 6 models the wiring connecting between the circuit element 31 and the circuit element BF1 with the use of the resistance Rm' and two capacitance Cm1', Cm2', which designate the resistance component and the capacitance component of the wiring that connects between the circuit element 31 and the circuit element BF1. Here, the delay presumption portion 6 sets the resistance value of the resistance Rm' as 0 (zero), the capacitance value cm1' of the capacitance Cm1' as a capacitance value of the input terminal of the circuit element BF1, and the capacitance value of the capacitance Cm2' as 0 (zero). The time lag component of the wiring that connects between the circuit element 31 and the circuit element BF1 is set to 0 (zero).

The delay presumption portion 6 supposes that the wiring that connects between the circuit element BF1 and the circuit element 32 is interchangeable with the wiring, shown in FIG. 3A, that connects between the circuit element 31 and the circuit element 32.

④ In a case where two buffers are to be added to imaginary overlap the circuit element 32. <FIG. 3D>
(A case where the to-be-added buffers are previously assumed to be arranged close to the circuit element 32 or where the buffers can be directed to be added to the side of the circuit element 32)

As shown in FIG. 3D, the delay presumption portion 6 supposes that the wiring connecting between the circuit element 31 and the circuit element BF2 is interchangeable with the wiring, shown in FIG. 3A, that connects between the circuit element 31 and the circuit element 32.

The delay presumption portion 6 also models the wiring connecting between the circuit element BF2 and the circuit element BF3 with the use of the resistance Rm1 and two capacitance Cm3, Cm4, which designate the resistance component and the capacitance component of the wiring that connects between the circuit element BF2 and the circuit element BF3. Similarly, the delay presumption portion 6 models the wiring connecting between the circuit element BF3 and the circuit element 32 with the use of the resistance Rm2 and two capacitance Cm5, Cm6, which designate the resistance component and the capacitance component of the wiring that connects between the circuit element BF3 and the circuit element 32.

Here, the delay presumption portion 6 sets the resistance values of the resistances Rm1, Rm2 as 0 (zero), respectively, and the capacitance values of the capacitance Cm4, Cm6 as 0 (zero). The capacitance value cm3 of the capacitance Cm3 is set as the capacitance value of the input terminal of the circuit element BF3, the capacitance value cm5 of the capacitance Cm5 as the capacitance value of the input terminal of the circuit element 32. The time lag components of the wiring that connects between the circuit element BF2 and the circuit element BF3, and between the circuit element BF3 and the circuit element 32 are set to 0 (zero), respectively.

The delay presumption portion 6 creates such delay estimation models as shown in FIGS. 3A to 3D in which the wiring between respective circuit elements relating to the buffer added is modeled depending on a position and the number of the buffer added, and then presuming the delay information. Thereby the delay information can be updated without designing the layout after the timing adjustment. This allows to analyze/test the timing without designing the layout that is required after the timing adjustment in conventional arts.

FIG. 3 shows, as one example of delay estimation models, the cases where ①  the buffer is not added, ② the to-be-added buffer is arranged to imaginary overlap the circuit element 32, ③ the to-be-added buffer is arranged to imaginary overlap the circuit element 31, and ④ two buffers are to be added to imaginary overlap the circuit element 32, respectively. Such a case as two buffers are to be added to imaginary overlap the circuit element 31, or as three buffers are to be added may also be modeled as with the above-mentioned cases ②, ③, and ④.

The timing analysis is thus carried out by presuming the delay information with the use of the delay circuit models that correspond to the modified net list, which enables to obtain the analysis result nearly in-line with that of when the timing analysis is carried out by designing the layout with the modified net list to obtain the delay information. There is more than 90% correspondence between the result of the timing analysis with the delay information that is presumed with the use of the delay circuit models, which is carried out by inventors of the present invention, and that with the delay information that is obtained by designing the layout.

According to thus-described embodiment in detail above, when the timing error is recognized at the timing test portion 2 in the timing test, during which the provided net list and delay information of the integrated circuit are used, the circuit modification portion 5 modifies the net list to recover the timing error. The delay presumption portion 6 further presumes the delay information by modeling the circuit relating to the modified net list without designing the layout with the modified net list. Thereafter the net list and the delay information in the integrated circuit are updated in the information update portion 7, based on the modified net list and the presumed delay information to re-test the timing in the timing test portion 2.

It is the delay presumption portion 6 that enables to immediately presume the delay information with the modified net list by modeling the circuit relating to the modified net list, as if the layout was designed. This allows to carry out the timing analysis test for the circuit relating to the modified net list without designing the layout with the modified net list, which is required in a conventional design method to obtain the delay information. Thereby through reducing the number of designing the layout in the integrated circuit design, or shortening time required for the layout design in the integrated circuit design, it is made possible to shorten the time required for the layout design process in which the layout design, timing analysis/test, and timing adjustment are carried out.

For example, in the design system operation of the integrated circuit shown in FIG. 2, the layout design is required at least twice to update the delay information in the step S7 and the step S12 in the conventional design method, while according to this embodiment the layout design is not required even once to update the delay information.

The design system of the integrated circuit of above-mentioned embodiment may be composed of CPU, MPU, RAM, ROM, or the like in a computer, and realized by operating a program stored in the RAM or ROM, wherein this program is included in the embodiment of the present invention. It may also be realized by recording the program that operates the computer to function as described above, in a record medium such as a CD-ROM to be read by the computer, wherein this record medium recorded with the program therein is included in the embodiment of the present invention. Such a program product as the computer-readable record medium or the like recorded therein with the program may also be applied to the embodiment of the present invention. This program, record medium, transmission medium (internet and the like transmitting the program), and program product are included in the scope of the present invention. As the record medium for recording the program, a flexible disk, hard disk, magnetic tape, magneto-optic disk, nonvolatile memory card, or the like may be used other than the CD-ROM.

The functions of the embodiment may be realized not only by executing the provided program with the computer, but also by its program cooperating with an OS (operating system), other application software, or the like active in the computer, or by performing all or a part of a provided program process in a function expansional board or a function expansional unit of the computer, wherein the related programs are included in the embodiment of the present invention.

All or a part of the program may be executed in other computers to use the present invention in a network environment.

Figure 4:
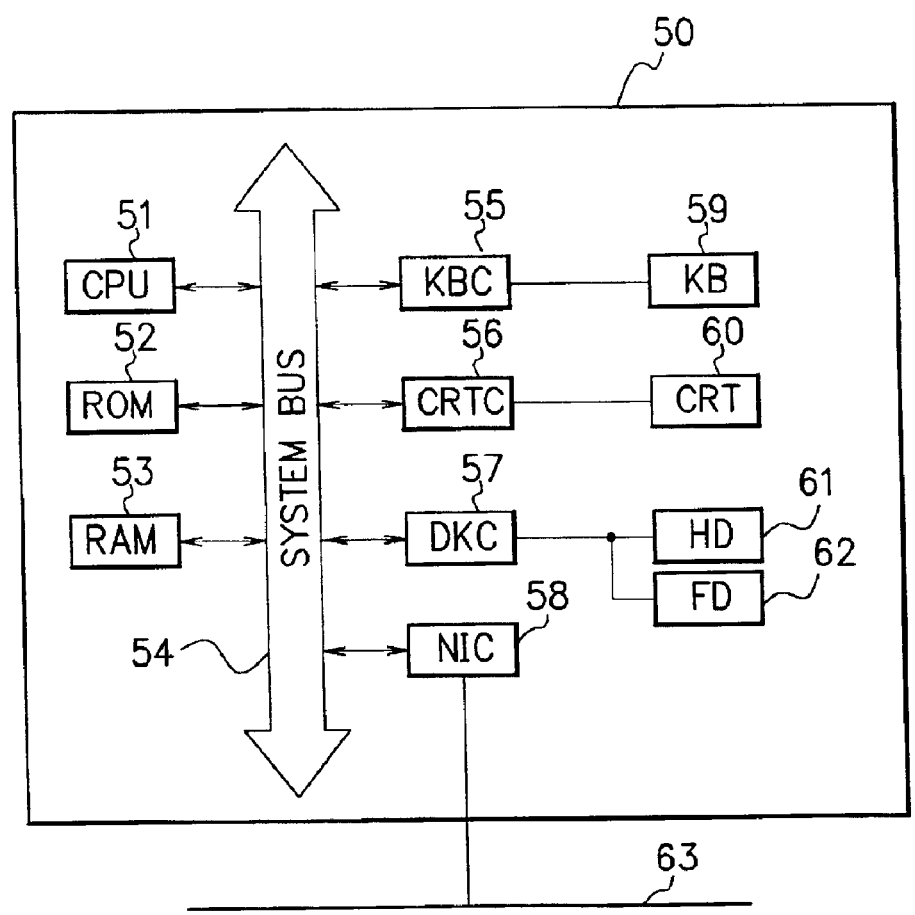
FIG. 4 is a block diagram showing one example of a computer configuration achievable of the integrated circuit design system.
Figure 6:
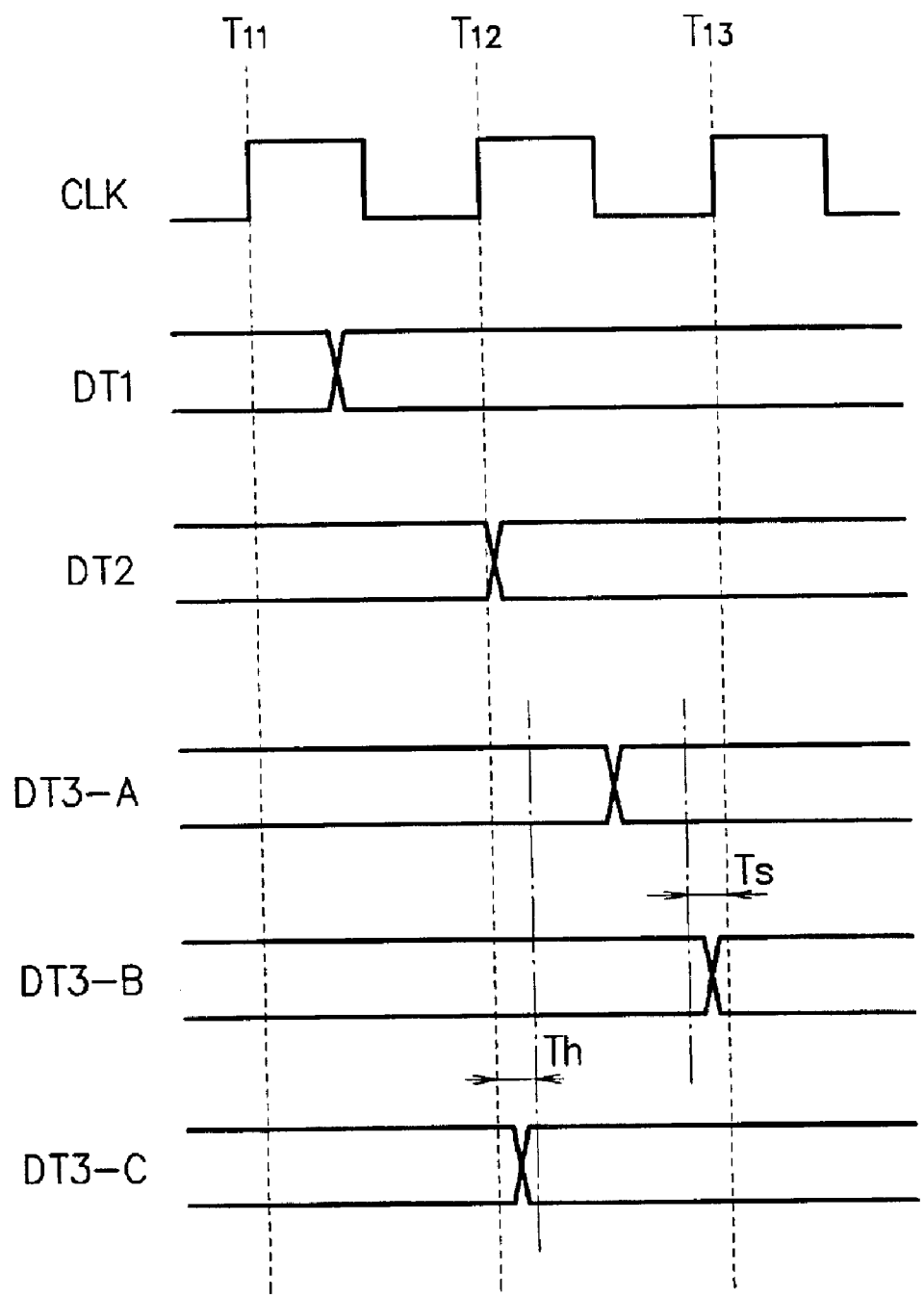
FIG. 6 is a timing chart showing one example of the circuit operation shown in FIG. 5.

For example, the design system of the integrated circuit shown in this embodiment has a computer function 50 shown in FIG. 4, and its CPU 51 executes an operation in this embodiment.

As shown in FIG. 4, the computer function 50 is composed of a CPU 51, a ROM 52, a RAM 53, a key board controller (KBC) 55 of a key board (KB) 59, a CRT controller (CRTC) 56 of a CRT display (CRT) 60 as a display portion, a disk controller (DKC) 57 of a hard disk (HD) 61 and a flexible disk (FD) 62, and a network interface card (NIC) 58, which are communicatably connected to each other via a system bus 54.

The CPU 51 executes software (program) stored in the ROM 52 or HD 61, or software (program) provided from the FD 62 to control respective components connected to the system bus 54 all-inclusively.

Meaning that the CPU 51 reads out and executes a processing program for the above-mentioned operation from the ROM 52, HD 61, or FD 62, thereby controlling to realize the operation in this embodiment.

The RAM 53 functions as a main memory, a work area, or the like of the CPU 51.

The KBC 55 controls a directive input from the KB 59, a pointing device not shown, or the like.

The CRTC 56 controls a CRT 60 display.

The DKC 57 controls an access to a boot program, various applications, a user file, a network manager, and the HD 61 and FD 62 that store these processing programs in this embodiment.

The NIC 58 transmits data bidirectionally with other devices on the network 63.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

As described above, when modifying circuit information to recover a timing error recognized in a timing test, the present invention presumes delay information from the modified circuit information without designing layout to re-test the timing after updating the circuit information and delay information of the integrated circuit.

This allows to immediately presume the delay information from the modified circuit information without designing the layout after modifying the circuit information, which is required in a conventional design method to obtain the delay information, and then to carry out a timing analysis test. As a result, time required for designing the layout after modifying the circuit information is saved, which results in shortening time required for a layout design process in the integrated circuit design.

What is claimed is:

1. A design system of an integrated circuit, comprising:
   a timing test portion testing timing of the integrated circuit, based on circuit information and delay information indicating a circuit structure of the integrated circuit;
   a circuit modification portion modifying the circuit information, based on timing error recognized in said timing test portion;
   a delay presumption portion presuming the delay information from the modified circuit information without designing layout with the circuit information modified in said circuit modification portion; and
   an information update portion updating the circuit information and delay information of the integrated circuit based on the circuit information modified in said circuit modification portion and the delay information presumed in said delay presumption portion, to provide to said timing test portion,
   wherein when a timing error is recognized in the timing test portion, based on the timing error, the circuit information is modified to insert or delete circuit elements that delay a signal in a signal propagation path relating to the timing error, and
   wherein delay circuit models represent a signal propagation path between circuit elements composing the integrated circuit of one resistance and two capacitance.

2. The design system of the integrated circuit according to claim 1, wherein said delay presumption portion presumes the delay information by making delay circuit models corresponding to the circuit information modified in said circuit modification portion.

3. The design system of the integrated circuit according to claim 1, wherein said timing test portion comprises a timing analysis portion analyzing the timing of the integrated circuit based on the circuit information and delay information of the integrated circuit, and a determination portion determining whether the timing error exists in the integrated circuit or not based on an analysis result from the timing analysis portion.

4. The design system of the integrated circuit according to claim 1, wherein said circuit modification portion modifies the circuit information to insert circuit elements that delay a signal to a signal propagation path relating to a hold error, when the hold error is recognized in said timing test portion.

5. The design system of the integrated circuit according to claim 4, wherein said circuit modification portion modifies the circuit information to delete the circuit elements that delay the signal, when said timing test portion recognizes set-up error appeared by modifying the circuit information to insert the circuit elements that delay the signal.

6. A design system of an integrated circuit, comprising:
   a delay presumption portion presuming delay information from modified circuit information without designing layout with the modified circuit information, when the circuit information of the integrated circuit obtaining therein the circuit information and the delay information indicating a circuit structure is modified;
   an information update portion updating the circuit information and delay information or the integrated circuit, based on the modified circuit information and the delay information presumed in said delay presumption portion; and
   a timing analysis portion analyzing timing of the integrated circuit, base on the circuit information and delay information updated in said information update portion,
   wherein when a timing error is recognized in the timing analysis portion, based on the timing error, the circuit information is modified to insert or delete circuit elements that delay a signal in a signal propagation path relating to the timing error, and
   wherein delay circuit models represent a signal propagation path between circuit elements composing the integrated circuit of one resistance and two capacitance.

7. The design system of the integrated circuit according to claim 6, wherein said delay presumption portion presumes the delay information by making delay circuit models corresponding to the modified circuit information.

8. A design method of an integrated circuit, comprising:
   a timing test step for testing timing of the integrated circuit based on circuit information and delay information indicating a circuit structure of the integrated circuit;
   a circuit modification step for modifying the circuit information to recover a timing error when the timing error is recognized in said timing test;
   a delay presumption step for presuming the delay information from said modified circuit information without designing layout with the modified circuit information; and
   an information update step for updating the circuit information and delay information of said integrated circuit based on said modified circuit information and said presumed delay information, to test the timing of said integrated circuit,
   wherein when a timing error is recognized in the timing test step, based on the timing error, the circuit information is modified to insert or delete circuit elements that delay a signal in a signal propagation path relating to the timing error, and
   wherein delay circuit models represent a signal propagation path between circuit elements composing the integrated circuit of one resistance and two capacitance.

9. The design method of the integrated circuit according to claim 8, wherein the delay presumption step presumes, the delay information by making delay circuit models corresponding to the modified circuit information.

10. The design method of the integrated circuit according to claim 8, wherein the circuit modification step modifies, the circuit information by inserting circuit elements that delay a signal to a signal propagation path relating to a hold error, when the hold error is recognized in said timing test.

11. The design method of the integrated circuit according to claim 10, wherein in said timing test based on the updated circuit information and delay information of the integrated circuit, the circuit information is modified by deleting the circuit elements that delay the signal when said timing test recognizes set-up error appeared by modifying the circuit information to insert the circuit elements that delay the signal.

12. A design method of an integrated circuit, comprising:
   a delay presumption step for presuming delay information from modified circuit information without designing layout with the modified circuit information, when circuit information of said integrated circuit obtaining therein the circuit information and delay information indicating a circuit structure is modified;
   an information update step for updating the circuit information and delay information of said integrated circuit based on the modified circuit information and said presumed delay information; and a timing analysis step for analyzing timing of the integrated circuit based on said updated circuit information and delay information, wherein when a timing error is recognized in a timing analysis step, based on the timing error, the circuit information is modified to insert or delete circuit elements that delay a signal in a signal propagation path relating to the timing error, and wherein delay circuit models represent a signal propagation path between circuit elements composing the integrated circuit of one resistance and two capacitance.

13. The design method of the integrated circuit according to claim 12, wherein the delay presumption step includes to presume the delay information by making delay circuit models corresponding to the modified circuit information.

14. A program product for having a computer to execute the steps, comprising:

a timing test step testing timing of the integrated circuit, based on circuit information and delay information indicating a circuit structure of said integrated circuit;

a circuit modification step modifying the circuit information based on a timing error recognized in said timing test step;

a delay presumption step presuming the delay information from the modified circuit information without designing layout with the circuit information modified in said circuit modification step; and an information update step updating the circuit information and delay information of said integrated circuit, based on the circuit information modified in said circuit modification step and the delay information presumed in said delay presumption step, wherein when a timing error is recognized in a timing test step, based on the timing error, the circuit information is modified to insert or delete circuit elements that delay a signal in a signal propagation path relating to the timing error, and wherein delay circuit models represent a signal propagation path between circuit elements composing the integrated circuit of one resistance and two capacitance.

15. The program product according to claim 14, wherein said delay presumption step presumes the delay information by making delay circuit models corresponding to the circuit information modified in said circuit modification step.

16. The program product according to claim 14, wherein said timing test step comprises a timing analysis step analyzing timing of said integrated circuit based on the circuit information and delay information of the integrated circuit, and a determination step determining whether a timing error exists in the integrated circuit or not based on an analysis result at the timing analysis step.

17. A program product for having a computer to execute the steps, comprising:

a delay presumption step presuming delay information from modified circuit information without designing layout with the modified circuit information, when the circuit information of the integrated circuit obtaining therein the circuit information and delay information indicating a circuit structure is modified;

an information update step updating the circuit information and delay information of the integrated circuit based on the modified circuit information and the delay information presumed in said delay presuming step; and a timing analysis step analyzing timing of the integrated circuit, based on the circuit information and delay information updated in said information update step, wherein when a timing error is recognized in the timing analysis step, based on the timing error, the circuit information is modified to insert or delete circuit elements that delay a signal in a signal propagation path relating to the timing error, and wherein delay circuit models represent a signal propagation path between circuit elements composing the integrated circuit of one resistance and two capacitance.

18. The program product according to claim 17, wherein said delay presumption step presumes the delay information by making delay circuit models corresponding to the modified circuit information.

19. A method for designing an integrated circuit, comprising:

testing timing of the integrated circuit based on circuit information and delay information indicating a circuit structure of the integrated circuit to recover a timing error;

modifying the circuit information to recover the timing error when the timing error is recognized in the testing;

presuming the delay information from the modified circuit information without designing a layout with the modified circuit information; and updating the circuit information and delay information of the integrated circuit based on the modified circuit information and the presumed delay information, to test the timing of the integrated circuit, wherein when a timing error is recognized in test testing timing of said integrated circuit, based on the timing error, the circuit information is modified to insert or delete circuit elements that delay a signal in a signal propagation path relating to the timing error.

20. A method for designing an integrated circuit, comprising:

detecting a timing error of an integrated circuit based on first circuit information; and presuming delay information from modified second circuit information of the integrated circuit without designing a layout with the modified second circuit information when the timing error is detected in the integrated circuit, wherein when a timing error is detected, based on the timing error, the first circuit information is modified to insert or delete circuit elements that delay a signal in a signal propagation path relating to the timing error.

* * * * *

UNITED STATES PATENT AND TRADEMARK OFFICE
CERTIFICATE OF CORRECTION

PATENT NO. : 6,871,329 B2
DATED : March 22, 2005
INVENTOR(S) : Sho Matsumoto

It is certified that error appears in the above-identified patent and that said Letters Patent is hereby corrected as shown below:

Column 12,
Line 2, change "base" to -- based --.

Signed and Sealed this

Fourth Day of October, 2005

JON W. DUDAS
*Director of the United States Patent and Trademark Office*